United States Patent
Kim et al.

(10) Patent No.: US 10,062,799 B2
(45) Date of Patent: Aug. 28, 2018

(54) QUANTUM-DOT PHOTOACTIVE-LAYER AND METHOD FOR MANUFACTURE THEREOF

(71) Applicant: KOREA RESEARCH INSTITUTE OF STANDARDS AND SCIENCE, Daejeon (KR)

(72) Inventors: Ansoon Kim, Daejeon (KR); Kyung Joong Kim, Daejeon (KR); Songwoung Hong, Daejeon (KR)

(73) Assignee: Korea Research Institute of Standards and Science, Daejeon (KR)

( * ) Notice: Subject to any disclaimer, the term of this patent is extended or adjusted under 35 U.S.C. 154(b) by 86 days.

(21) Appl. No.: 14/884,644

(22) Filed: Oct. 15, 2015

(65) Prior Publication Data

US 2017/0062646 A1 Mar. 2, 2017

(30) Foreign Application Priority Data

Aug. 25, 2015 (KR) .................... 10-2015-0119407

(51) Int. Cl.
*H01L 31/00* (2006.01)
*H01L 31/18* (2006.01)
*H01L 33/00* (2010.01)
*H01L 33/06* (2010.01)
*H01L 31/074* (2012.01)
*H01L 31/0352* (2006.01)

(52) U.S. Cl.
CPC .. *H01L 31/1804* (2013.01); *H01L 31/035218* (2013.01); *H01L 31/074* (2013.01); *H01L 33/0058* (2013.01); *H01L 33/06* (2013.01); *Y02E 10/50* (2013.01)

(58) Field of Classification Search
None
See application file for complete search history.

(56) References Cited

U.S. PATENT DOCUMENTS

| | | | | |
|---|---|---|---|---|
| 2005/0098205 A1* | 5/2005 | Roscheisen | ............ | B82Y 10/00 136/263 |
| 2011/0146775 A1* | 6/2011 | Kim | ................ | H01L 31/035218 136/255 |
| 2012/0181503 A1* | 7/2012 | Lee | ................... | H01L 29/78642 257/13 |

FOREIGN PATENT DOCUMENTS

| KR | 1020100019722 A | 2/2010 |
|---|---|---|
| KR | 20120058840 A | 6/2012 |
| KR | 101189686 B1 | 10/2012 |

OTHER PUBLICATIONS

17th International Symposium on the Physics of Semiconductors and Applications, Final program and abstract book, Dec. 2014, 4 pages.

* cited by examiner

*Primary Examiner* — Eli Mekhlin
(74) *Attorney, Agent, or Firm* — McCoy Russell LLP (57) ABSTRACT

Provided are a method of manufacturing a quantum-dot photoactive-layer including: alternately depositing an amorphous silicon compound layer and a silicon-rich compound layer containing conductive impurities and an excess of silicon based on a stoichiometric ratio on a silicon substrate to form a composite multi-layer; and heat treating the composite multi-layer to form a plurality of silicon quantum-dots in a matrix corresponding to a silicon compound, wherein an amorphous silicon layer containing the conductive impurities is formed at least one time instead of the silicon-rich compound layer, and a quantum-dot photoactive-layer manufactured using the method as described above.

5 Claims, 5 Drawing Sheets

QUANTUM-DOT PHOTOACTIVE-LAYER AND METHOD FOR MANUFACTURE THEREOF

CROSS-REFERENCE TO RELATED APPLICATIONS

This application claims priority under 35 U.S.C. § 119 to Korean Patent Application No. 10-2015-0119407, filed on Aug. 25, 2015, in the Korean Intellectual Property Office, the disclosure of which is incorporated herein by reference in its entirety.

TECHNICAL FIELD

The following disclosure relates to a quantum-dot photoactive-layer and a method of manufacturing the same, and more particularly, to a silicon quantum-dot photoactive-layer for a solar cell or light emitting diode, and a method of manufacturing the same.

BACKGROUND

In a solar cell industry, solar cells are classified into a first generation solar cell, a second generation solar cell, and a third generation solar cell, in consideration of manufacturing cost and efficiency. The first generation solar cell is a crystalline silicon solar cell which has been developed over the last several decades, and currently, the crystalline silicon solar cell accounts for more than 80% of the entire solar cell. The second generation solar cell, which is a solar cell for compensating for disadvantages of a silicon solar cell having relatively high efficiency but expensive manufacturing cost, means a thin film solar cell made of amorphous silicon, a compound and an organic thin film, and the like. In addition, the third generation solar cell, which is a solar cell for obtaining high efficiency at low cost, is a new conceptual solar cell utilizing a nano structure and a quantum-dot (QD).

Since the silicon solar cell, which is the first generation solar cell, has already reached a technical limit, currently, research into and development of the second generation thin film solar cell has been mainly and actively conducted. However, in order to rapidly reach grid parity of the solar cell, development of a low-cost and high-efficiency third generation solar cell has been demanded.

As a general technology for forming a silicon quantum-dot, which is a core of the third generation solar cell, according to the related art, there is a method of forming the quantum-dot by adding a larger amount of silicon than an amount of silicon required to form $SiO_2$ having an accurate composition at the time of depositing a silicon dioxide film ($SiO_2$) to allow the larger amount of silicon to be precipitated during a thermal treatment process.

However, in the method according to the related art, there is advantage in that it is possible to form quantum-dots at distances relatively equal to each other from a channel in which a current flows while obtaining a sufficient throughput during a process of forming the quantum-dots, but there are disadvantages in that the distances are relatively long, such that a density of the quantum-dot is slightly low, and sizes and spatial distribution of the quantum-dots are not uniform.

Therefore, there is a need to develop a quantum-dot photoactive-layer in which a density of the quantum-dot is increased and sizes and spatial distribution of the quantum-dots are uniform.

As the related art associated to a method of manufacturing a quantum-dot, there is Korean Patent Laid-Open Publication No. 10-2012-0058840.

RELATED ART DOCUMENT

Patent Document

Korean Patent Laid-Open Publication No. 10-2012-0058840 (Jun. 8, 2012)

SUMMARY

An embodiment of the present invention is directed to providing a method of manufacturing a quantum-dot photoactive-layer capable of increasing photoelectric efficiency and light emitting efficiency by increasing a density of a silicon quantum-dot to decrease series resistance, and a quantum-dot photoactive-layer manufactured using the same.

In one general aspect, there are provided a method of manufacturing a quantum-dot photoactive-layer includes: alternately depositing an amorphous silicon compound layer and a silicon-rich compound layer containing conductive impurities and an excess of silicon based on a stoichiometric ratio on a silicon substrate to form a composite multi-layer; and heat treating the composite multi-layer to form a plurality of silicon quantum-dots in a matrix corresponding to a silicon compound, wherein an amorphous silicon layer containing the conductive impurities is formed at least one time instead of the silicon-rich compound layer, and a quantum-dot photoactive-layer manufactured using the same.

In another general aspect, a solar cell includes: the quantum-dot photoactive-layer as described above; a silicon substrate positioned below the photoactive-layer and containing impurities complementary to conductive impurities contained in the photoactive-layer; an upper electrode formed on the photoactive-layer; and a lower electrode formed below the silicon substrate.

In another general aspect, a light emitting diode includes: the quantum-dot photoactive-layer as described above; a silicon layer positioned below the photoactive-layer and containing impurities complementary to conductive impurities contained in the photoactive-layer; an upper electrode formed on the photoactive-layer; and a lower electrode formed below the silicon layer.

DETAILED DESCRIPTION OF MAIN ELEMENTS

110: Silicon substrate
120: Composite multi-layer
121: Amorphous silicon compound layer
122: Silicon-rich compound layer
123: Amorphous silicon layer
130: Quantum-dot photoactive-layer
131: Silicon quantum-dot
132: Matrix

DETAILED DESCRIPTION OF EMBODIMENTS

Hereinafter, a method of manufacturing a quantum-dot photoactive layer according to present invention will be described in detail with reference to the accompanying drawings. The following accompanying drawings are provided by way of example so that the idea of the present invention can be sufficiently transferred to those skilled in the art to which the present invention pertains. Therefore, the present invention is not limited to the drawings to be provided below, but may be modified in different forms. In addition, the drawings to be provided below may be exaggerated in order to clarify the scope of the present invention. In addition, like reference numerals denote like elements throughout the specification.

Here, technical terms and scientific terms used in the present specification have the general meaning understood by those skilled in the art to which the present invention pertains unless otherwise defined, and a description for the known function and configuration unnecessarily obscuring the gist of the present invention will be omitted in the following description and the accompanying drawings.

The present invention relates to a method of manufacturing a quantum-dot photoactive-layer in which a density of a silicon quantum-dot 131 in a photoactive-layer 130 is increased. According to the present invention, series resistance may be decreased by increasing the density of the silicon quantum-dot 131, such that in the case of using the quantum-dot photoactive-layer in a solar cell, photoelectric efficiency may be improved, and in the case of using the quantum-dot photoactive-layer in a light emitting device, light emitting efficiency may be improved.

Figure 1:
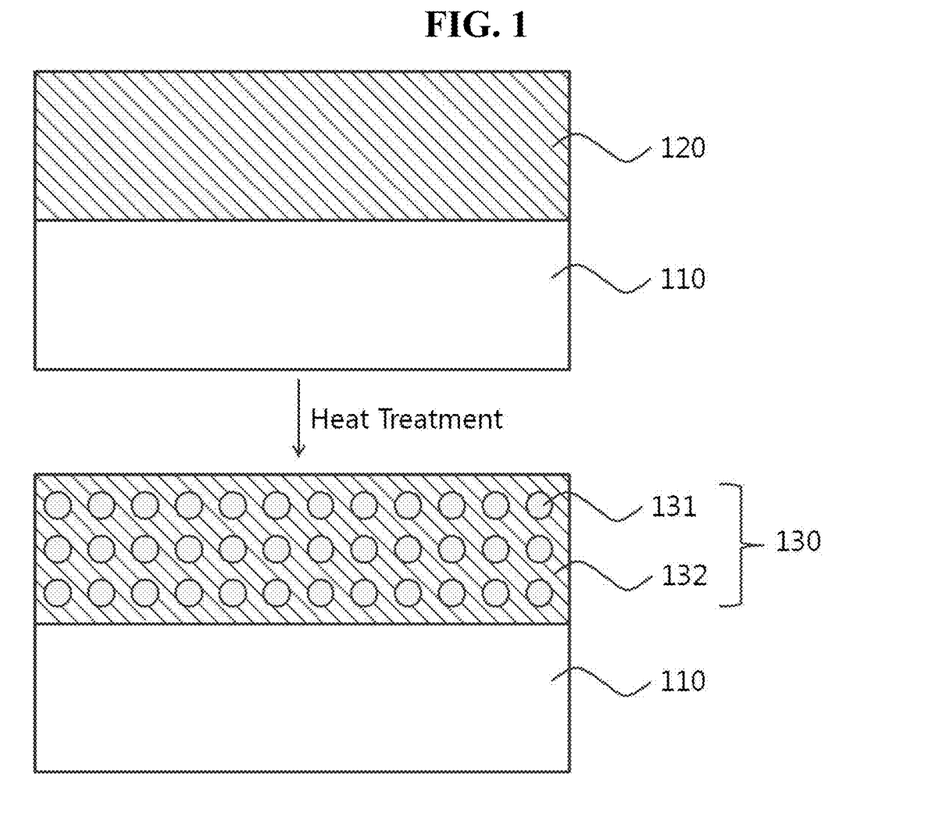
FIG. 1 is a process view illustrating a method of manufacturing a quantum-dot photoactive-layer according to an exemplary embodiment of the present invention.

FIG. 1 is a process view illustrating a method of manufacturing a quantum-dot photoactive-layer according to an exemplary embodiment of the present invention. As illustrated in FIG. 1, a quantum-dot photoactive-layer 130 in which silicon quantum-dots 131 are embedded in a matrix 132 corresponding to a silicon compound may be manufactured by forming a composite multi-layer 120 on a silicon substrate 110 and heat treating the composite multi-layer 120.

Figure 2:
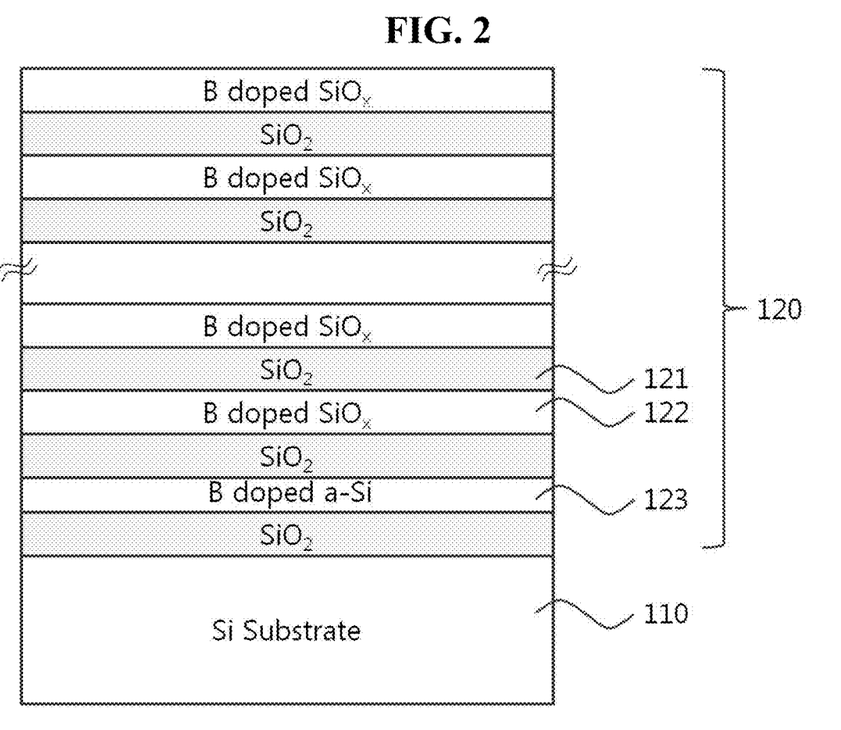
FIG. 2 is a process view illustrating a method of manufacturing a quantum-dot photoactive-layer according to still another exemplary embodiment of the present invention.

As illustrated in FIG. 2, the composite multi-layer 120 contains an amorphous silicon compound layer 121, a silicon-rich compound layer 122 containing conductive impurities and an excess of silicon based on a stoichiometric ratio, and an amorphous silicon layer 123 containing conductive impurities. As a specific example, the amorphous silicon compound layer 121 may be made of an amorphous silicon nitride, an amorphous silicon oxide, an amorphous silicon carbide, or a mixture thereof, and the silicon-rich compound layer may be made of a silicon-rich nitride, a silicon-rich oxide, a silicon-rich carbide, or a mixture thereof. In the amorphous silicon compound layer 121 and the silicon-rich compound layer 122, configuration elements forming each of the layers may be the same as or different from each other, but it is preferable that the configuration elements are the same as each other. That is, it is preferable that in the case in which the amorphous silicon compound layer 121 is made of the amorphous silicon oxide, the silicon-rich compound layer 122 is also made of the silicon-rich oxide, in the case in which the amorphous silicon compound layer 121 is made of the amorphous silicon nitride, the silicon-rich compound layer 122 is also made of the silicon-rich nitride, and in the case in which the amorphous silicon compound layer 121 is made of the amorphous silicon carbide, the silicon-rich compound layer 122 is also made of the silicon-rich carbide. In this case, a silicon-rich compound containing the excess of silicon based on the stoichiometric ratio may mean a silicon compound represented by Chemical Formulas $SiO_X$, $Si_3N_Y$, and/or $SiC_z$ (x, y, and z satisfy $0.5<X<2$, $1<Y<4$, and $0.1<Z<1$, respectively).

Further, it is preferable that the conductive impurities contained in the silicon-rich compound layer and the amorphous silicon layer are the same as each other, and the conductive impurities may be p-type impurities generating holes or n-type impurities generating electrons. As a specific example, the p-type impurities may be B, Al, or the like, and the n-type impurities may be P, As, or the like.

Figure 3:
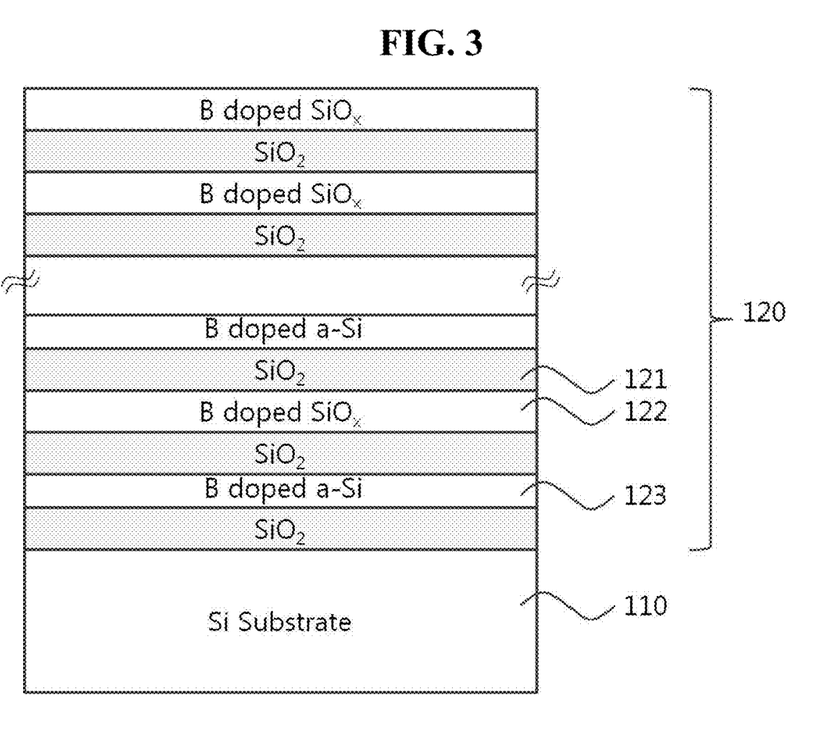
FIG. 3 is a process view illustrating a method of manufacturing a quantum-dot photoactive-layer according to another exemplary embodiment of the present invention.

In detail, the method of manufacturing a quantum-dot photoactive-layer according to the present invention includes alternately depositing the amorphous silicon compound layer 121 and the silicon-rich compound layer 122 containing the conductive impurities and the excess of silicon based on the stoichiometric ratio on the silicon substrate 110 to form the composite multi-layer 120; and heat treating the composite multi-layer 120 to form a plurality of silicon quantum-dots 131 in the matrix 132 corresponding to the silicon compound, wherein the amorphous silicon layer 123 containing the conductive impurities may be formed at least one time instead of the silicon-rich compound layer 122 as illustrated in FIG. 3.

That is, not that the amorphous silicon compound layer 121 and the silicon-rich compound layer 122 are simply alternately deposited, but the amorphous silicon layer 123 is inserted instead of the silicon-rich compound layer 122, thereby making it possible to prevent the excess of silicon of the silicon-rich compound layer 122 from being diffused toward the silicon substrate 110 and being aggregated with silicon in the substrate. Therefore, it is possible to allow the silicon quantum-dots 31 to be positioned in a planned section of the quantum-dot photoactive-layer 130 after heat treatment and uniformly distributed in the section.

As a specific example, as illustrated in FIG. 2, a lowermost layer of the composite multi-layer 120 may be the amorphous silicon compound layer 121, and an uppermost layer thereof may be the silicon-rich compound layer 122 or the amorphous silicon compound layer 121. In this case, the amorphous silicon layer 123 may be formed to contact an upper portion of the amorphous silicon compound layer 121, which is the lowermost layer of the composite multi-layer 120. As the amorphous silicon layer 123 is formed as described above, it is possible to effectively prevent the excess of silicon of the silicon-rich compound layer 122 from being diffused toward the silicon substrate 110, such that the density of the silicon quantum-dot 131 may be increased by decreasing the distance from an uppermost boundary surface of the silicon substrate 110 to the silicon quantum-dot 131 after heat treatment, which is preferable in view of maximizing photoelectric efficiency of a solar cell or light emitting efficiency of a light emitting device.

Figure 4A:
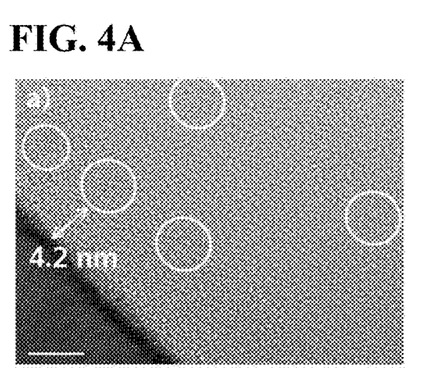
FIGS. 4A to 4C are transmission electron microscope (TEM) images of quantum-dot photoactive-layers according to Example 1 (FIG. 4A), Example 2 (FIG. 4B), and Comparative Example 1 (FIG. 4C).
Figure 4B:
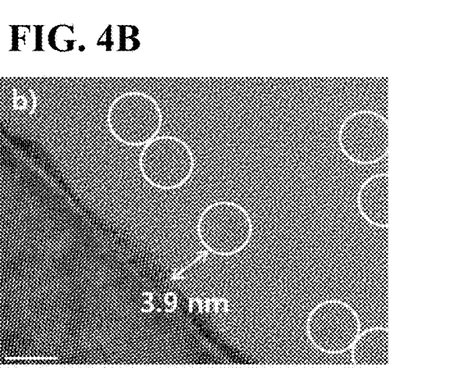
Figure 4C:
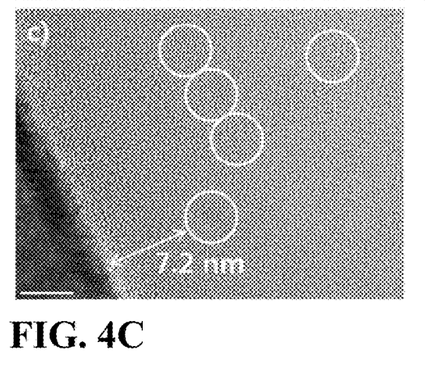

A specific example of the quantum-dot photoactive-layer according to the present invention in which the density of the silicon quantum-dot 131 is increased as illustrated in FIGS. 4A to 4C. FIGS. 4A to 4C are transmission electron microscope (TEM) images of quantum-dot photoactive-layers according to Example 1 (FIG. 4A), Example 2 (FIG. 4B), and Comparative Example 1 (FIG. 4C). In detail, FIG. 4A is a TEM image of a quantum-dot photoactive-layer 130 of Example 1 manufactured by heat treating a composite multi-layer 120 in which one amorphous silicon layer 123 is inserted as illustrated in FIG. 2, FIG. 4B is a TEM image of a quantum-dot photoactive-layer 130 of Example 2 manufactured by heat treating a composite multi-layer 120 in which two amorphous silicon layers 123 are inserted as illustrated in FIG. 3, and FIG. 4C is a TEM image of a quantum-dot photoactive-layer of Comparative Example 1 manufactured by heat treating a composite multi-layer in which the amorphous silicon layer 123 is not inserted.

As illustrated in FIGS. 4A to 4C, it may be appreciated that in FIGS. 4A and 4B (Examples 1 and 2) in which the amorphous silicon layer 123 is inserted, a density of the silicon quantum-dot 131 is high as compared to Comparative Example 1 (FIG. 4C) in which the amorphous silicon layer 123 is not inserted. In detail, in the cases in FIGS. 4A and 4B, it may be confirmed that silicon quantum-dots 131 are initially formed (sequence depending on the distance rather the time) at points spaced apart from uppermost boundary surfaces of the silicon substrates 110 by 4.2 nm and 3.6 nm, respectively, such that the silicon quantum-dots 131 are formed to have a higher density. However, in the case in FIG. 4C, it may be confirmed that a silicon quantum-dot 131 is initially formed at a point spaced apart from an uppermost boundary surface of the silicon substrate 110 by 7.2 nm, such that a density of the silicon quantum-dot 131 is lower in the vicinity of the uppermost boundary surface of the silicon substrate 110, as compared to Examples 1 and 2 according to the present invention.

In addition, as illustrated in FIGS. 2 and 3, one amorphous silicon layer 123 or a plurality of amorphous silicon layers 123 may be formed in the composite multi-layer 120, and the amorphous silicon compound layer 121, the silicon-rich compound layer 122, and the amorphous silicon layer 123 of the composite multi-layer 120 may satisfy the following Correlation Equations 1 and 2.

$$N_B \geq N_C \geq 1 \quad \text{[Correlation Equation 1]}$$

$$N_C = N_A - N_B \quad \text{[Correlation Equation 2]}$$

In Correlation Equations 1 and 2, $N_A$ is the number of amorphous silicon compound layer in the composite multi-layer, $N_B$ is the number of silicon-rich compound layer in the composite multi-layer, and $N_C$ is the number of amorphous silicon layer in the composite multi-layer. In detail, the number of each of the layers in the composite multi-layer may be changed depending on an application field of the quantum-dot photoactive-layer. As a non-restrictive and specific example, in the case of using the quantum-dot photoactive-layer in a solar cell, $N_A$ may be 2 to 2500, preferably 25 to 500. As another non-restrictive and specific example, in the case of using the quantum-dot photoactive-layer in a light emitting diode, $N_A$ may be 2 to 2500, preferably 25 to 500.

As described above, the amorphous silicon layer 123 is inserted into the composite multi-layer 120 so as to satisfy Correlation Equation 1, thereby making it possible to more effectively prevent the amorphous silicon compound layer 121 from being diffused to different layers and being aggregated with each other, and allow the silicon quantum-dots 131 to have a uniform size and be uniformly distributed in the planned section after heat treatment. Particularly, it is preferable that one amorphous silicon layer 123 or at least one of the plurality of amorphous silicon layers 123 is formed to contact the upper portion of the amorphous silicon compound layer 121, which is the lowermost layer of the composite multi-layer 120. Therefore, the density of the silicon quantum-dot 131 may be increased by effectively preventing the excess of silicon of the silicon-rich compound layer 122 from being diffused toward the silicon substrate 110.

In addition, when two or more amorphous silicon layers 123 are inserted, it may not be preferable that the amorphous silicon layer 123 is alternately stacked in series two times or more. That is, in the composite multi-layer 120, a bilayer composed of one amorphous silicon compound layer 121 and one amorphous silicon layer 123 may not be repetitively formed in series two times or more. In the case in which the bilayer is repetitively formed in series two times or more, probability that the amorphous silicon layers 123 will be aggregated with each other may be increased, such that distribution of the silicon quantum-dots 131 may become significantly non-uniform, which is not preferable.

Further, the amorphous silicon compound layer 121, the silicon-rich compound layer 122, and the amorphous silicon layer 123 according to the exemplary embodiment may be deposited so as to satisfy the following Correlation Equations 3 and 4.

$$0.5 \leq A \leq B \quad \text{[Correlation Equation 3]}$$

$$0.1 \leq C < B \quad \text{[Correlation Equation 4]}$$

In Correlation Equations 3 and 4, A is a thickness (nm) of the amorphous silicon compound layer, B is a thickness (nm) of the silicon-rich compound layer, and C is a thickness (nm) of the amorphous silicon layer. Provided that, B may be 1 to 5 nm, preferably 1.5 to 3 nm.

As illustrated in Correlation Equations 3 and 4, in the composite multi-layer 120 according to the exemplary embodiment of the present invention, the amorphous silicon compound layer 121 may be deposited so as to have a thickness equal to or thinner than that of the silicon-rich compound layer 122, and the amorphous silicon layer 123 may be deposited so as to have a thickness thinner than that of the silicon-rich compound layer 122. The amorphous silicon layer 123 is deposited so as to have a thickness thinner than that of the silicon-rich compound layer 122 as described above, thereby making it possible to prevent the amorphous silicon layers 123 from being aggregated with each other.

In this case, each of the amorphous silicon compound layer 121, the silicon-rich compound layer 122, and the amorphous silicon layer 123 constituting the composite multi-layer 120 may be formed by a deposition process used to form a thin film in a general semiconductor process. For example, the amorphous silicon compound layer 121, the silicon-rich compound layer 122, and the amorphous silicon layer 123 may be each independently deposited using chemical deposition, physical deposition, physical-chemical deposition, plasma deposition, atomic layer deposition, or thermal evaporation deposition.

As described above, the composite multi-layer 120 according to the exemplary embodiment of the present invention has a structure in which the amorphous silicon compound layer 121 and the silicon-rich compound layer 122 are alternately deposited and the amorphous silicon layer 123 is deposited at least one time, preferably, at least two times, instead of the silicon-rich compound layer 122, and a thickness of the composite multi-layer 120 as described above may be changed depending on a final use, the numbers of deposited amorphous silicon compound layer 121, silicon-rich compound layer 122, and amorphous silicon layer 123, and the number of inserted amorphous silicon layer. As a non-restrictive and specific example, the thickness of the composite multi-layer may be 10 to 1000 nm.

When the composite multi-layer 120 is prepared as illustrated in FIG. 1, the quantum-dot photoactive-layer 130 in which the silicon quantum-dots 131 are embedded in the matrix 132 corresponding to the silicon compound may be manufactured by heat treatment. The heat treatment should be determined depending on the kind of matrix, the kind of compound in the composite multi-layer, and a size and density of quantum-dots to be manufactured. In the case in which a heat treatment temperature is excessively low at the time of manufacturing the silicon quantum-dots 131, movement of a material is difficult, such that it is difficult to obtain shapes of the silicon quantum-dots 131, and in the case in which the heat treatment temperature is excessively high, sizes of the silicon quantum-dots may be significantly non-uniform, and granulated particles in which a quantum confinement effect is insignificant may be formed. As a specific example of a temperature condition, heat treatment may be performed at a temperature of 700 to 1200° C. for 5 to 120 minutes, more preferably, at a temperature of 1000 to 1150° C. for 20 to 80 minutes. In view of forming silicon quantum-dots 131 having a uniform size, it is more effective to perform heat treatment in the above-mentioned temperature range. Further, it is preferable that heat treatment according to the exemplary embodiment of the present invention is performed under inert gas atmosphere such as nitrogen ($N_2$), argon (Ar), neon (Ne), helium (He), or the like.

In this case, the silicon compound, which is the matrix, may be changed depending on what compounds are used as the amorphous silicon compound layer 121 and the silicon-rich compound layer 122 of the composite multi-layer 120, and be a silicon oxide, a silicon nitride, a silicon carbide, or a mixture thereof. In order to confirm performance of solar cells including the quantum-dot photoactive-layer manufactured as described above, electrical properties of the solar cells were measured, and current density-voltage curves illustrated in FIG. 5 were obtained. In detail, a method of measuring the electrical properties were performed under standard test conditions (STC), and performed under the same conditions at which an incident irradiance was 100 mW/cm$^2$, a temperature of the solar cell was 25° C., and air mass (AM) was 1.5.

Figure 5:
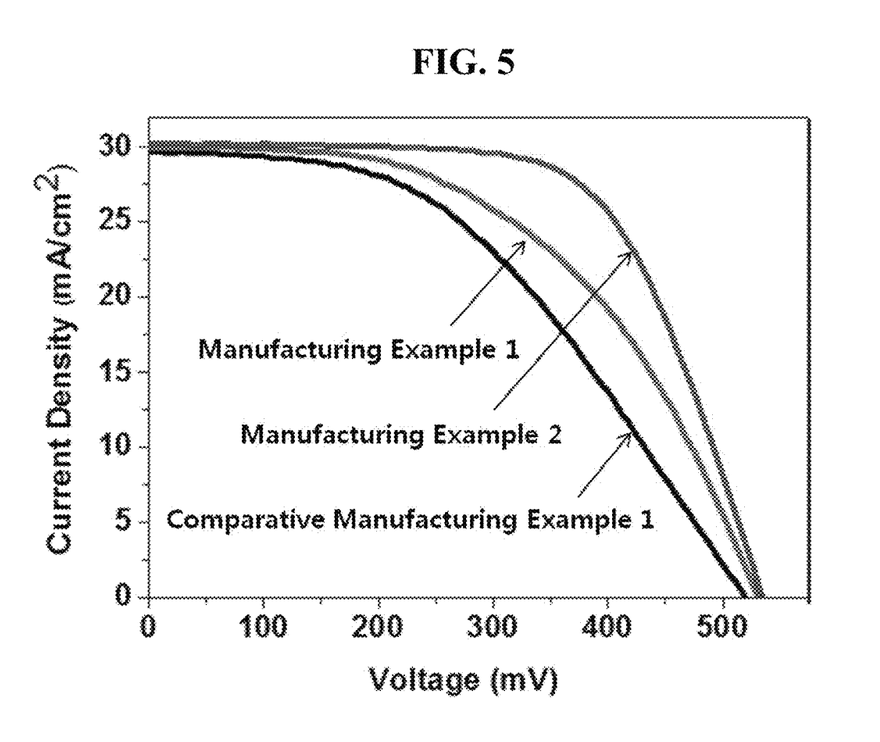
FIG. 5 is a graph illustrating current density-voltage curves of solar cells according to Manufacturing Examples 1 and 2 and Comparative Manufacturing Example 1.

FIG. 5 illustrates current density-voltage curves of solar cells manufactured using the quantum-dot photoactive-layers of Examples 1 and 2 and Comparative Example 1 illustrated in FIGS. 4A to 4C. Here, Manufacturing Example 1 was a solar cell including the quantum-dot photoactive-layer of Example 1, Manufacturing Example 2 was a solar cell including the quantum-dot photoactive-layer of Example 2, and Comparative Manufacturing Example 1 was a solar cell including the quantum-dot photoactive-layer of Comparative Example 1. In this case, Examples 1 and 2 and Comparative Example 1 are the same as those in FIGS. 4A to 4C.

In addition, open-circuit voltage ($V_{oc}$), short-circuit current density ($J_{sc}$), fill factor (FF), power conversion efficiency (PCE($\eta$)), shunt resistance ($R_{sh}$), series resistance ($R_s$), and the like, illustrated in Table 1 may be obtained from FIG. 5. Since a meaning of each of the terms is the same as that generally used, and calculation equations used in order to obtain $V_{oc}$, $J_{sc}$, FF, PCE($\eta$), $R_{sh}$, $R_s$, and the like, are the same as those in general methods, a detailed description thereof will be omitted.

TABLE 1

|  | Manufacturing Example 1 | Manufacturing Example 2 | Comparative Manufacturing Example 1 |
| --- | --- | --- | --- |
| $V_{oc}$ (mV) | 532 | 535 | 521 |
| $J_{sc}$ (mA/cm$^2$) | 30.0 | 30.2 | 29.7 |
| FF (%) | 55.5 | 64.4 | 47.6 |
| PCE (%) | 8.85 | 10.41 | 7.36 |
| $R_{sh}$ (ohm) | 4420.373 | 5334.218 | 1897.281 |
| $R_s$ (ohm) | 46.421 | 22.945 | 60.776 |

As illustrated in Table 1, it may be confirmed that both of the short-circuit current density and open-circuit voltage of the solar cells in Manufacturing Examples 1 and 2 were increased as compared to Comparative Manufacturing Example 1, and overall energy conversion efficiency was further improved. The reason may be that a density of the silicon quantum-dots in the quantum-dot photoactive-layer is increased by inserting the amorphous silicon layer in the composite multi-layer.

Further, in another general aspect, the present invention relates to a solar cell including the quantum-dot photoactive-layer as described above. In detail, the solar cell according to an exemplary embodiment of the present invention may include the quantum-dot photoactive-layer; a silicon substrate positioned below the photoactive-layer and containing impurities complementary to the conductive impurities contained in the photoactive-layer; an upper electrode formed on the photoactive-layer; and a lower electrode formed below the silicon substrate.

In the case in which the conductive impurities contained in the quantum-dot photoactive-layer are p-type impurities, the silicon substrate is a substrate containing n-type impurities. On the contrary, in the case in which the conductive impurities contained in the quantum-dot photoactive-layer are n-type impurities, the silicon substrate may be a substrate containing p-type impurities.

It is preferable that the upper electrode has a structure of a transparent electrode film and a metal pad on the transparent electrode film, and it is preferable that the transparent electrode film is formed on the entire region of a surface of the quantum-dot photoactive-layer. In this case, the upper and lower electrodes are manufactured by a general printing method such as a screen printing method, a stencil printing method, or the like, using a metal conductive paste, or a deposition method such as a plasma vapor deposition (PVD)/chemical vapor deposition (CVD) method, a thermal deposition method, a sputtering method, a deposition method using E-beam, or the like.

Further, in another general aspect, the present invention relates to a light emitting diode including the quantum-dot photoactive-layer as described above. The light emitting diode has a structure similar to that of the above-mentioned solar cell, but has a structure in which an upper electrode of the light emitting diode does not include a metal pad. In detail, the light emitting diode may include the quantum-dot photoactive-layer; a silicon layer positioned below the photoactive-layer and containing impurities complementary to the conductive impurities contained in the photoactive-layer; an upper electrode formed on the photoactive-layer;

and a lower electrode formed below the silicon layer. In this case, the quantum-dot photoactive-layer of the light emitting diode may be used as a quantum-dot light emitting layer. That is, the light emitting diode according to an exemplary embodiment of the present invention may include the quantum-dot light emitting layer; a silicon layer positioned below the light emitting layer and containing impurities complementary to the conductive impurities contained in the light emitting layer; an upper electrode formed on the light emitting layer; and a lower electrode formed below the silicon layer.

The upper and lower electrodes of the light emitting diode are formed by depositing or printing a conductive metal material generally used in an electrical device, and an example of the conductive metal material may include gold, silver, aluminum, copper, or the like.

What is claimed is:

1. A method of manufacturing a quantum-dot photoactive-layer, the method comprising:
    alternately depositing a plurality of amorphous silicon compound layers and silicon-rich compound layers containing conductive impurities on a silicon substrate to form a composite multi-layer, wherein the silicon-rich compound layers contain an excess of silicon based on a stoichiometric ratio; and
    heat treating the composite multi-layer to form a plurality of silicon quantum-dots in a matrix corresponding to a silicon compound,
    wherein the heat treating is performed at a temperature of 700 to 1200° C. for 5 to 120 minutes;
    wherein an amorphous silicon layer containing the conductive impurities is formed at least one time instead of a silicon-rich compound layer,
    wherein a lowermost layer of the composite multi-layer is an amorphous silicon compound layer, and wherein the lowermost layer rests directly on the silicon substrate, and the amorphous silicon layer containing the conductive impurities is formed to directly contact an upper portion of the amorphous silicon compound layer resting directly on the silicon substrate,
    and during the alternately depositing, an additional bilayer composed of one amorphous silicon compound layer and one amorphous silicon layer containing the conductive impurities is not repetitively formed in series.

2. The method of claim 1, wherein an uppermost layer of the composite multi-layer is the silicon-rich compound layer or the amorphous silicon compound layer.

3. The method of claim 1, wherein the amorphous silicon compound layer, the silicon-rich compound layer, and the amorphous silicon layer of the composite multi-layer satisfy the following Correlation Equations 1 and 2, wherein
    Correlation Equation 1 is $N_B \geq N_C \geq 1$, and Correlation Equation 2 is $N_C = N_A - N_B$, and wherein NA is a number of amorphous silicon compound layers in the composite multi-layer, $N_B$ is a number of silicon-rich compound layers in the composite multi-layer, and Nc is a number of amorphous silicon layers in the composite multi-layer.

4. The method of claim 1, wherein the amorphous silicon compound layer, the silicon-rich compound layer, and the amorphous silicon layer of the composite multi-layer satisfy the following Correlation Equations 3 and 4, wherein
    Correlation Equation 3 is $0.5$ nm $\leq A \leq B$, Correlation Equation 4 is $0.1$ nm $\leq C < B$, and wherein A is a thickness (nm) of the amorphous silicon compound layer, B is a thickness (nm) of the silicon-rich compound layer, and C is a thickness (nm) of the amorphous silicon layer, and wherein B is 1 to 5 nm.

5. The method of claim 1, wherein the amorphous silicon compound layer is made of an amorphous silicon nitride, an amorphous silicon oxide, an amorphous silicon carbide, or a mixture thereof; and the silicon-rich compound layer is made of a silicon-rich nitride, a silicon-rich oxide, a silicon-rich carbide, or a mixture thereof.

* * * * *